United States Patent
Homma et al.

(10) Patent No.: US 9,960,143 B2
(45) Date of Patent: May 1, 2018

(54) METHOD FOR MANUFACTURING ELECTRONIC COMPONENT AND MANUFACTURING APPARATUS OF ELECTRONIC COMPONENT

(71) Applicant: TOSHIBA MEMORY CORPORATION, Tokyo (JP)

(72) Inventors: Soichi Homma, Yokkaichi Mie (JP); Naoyuki Komuta, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days. days.

(21) Appl. No.: 15/253,878

(22) Filed: Sep. 1, 2016

(65) Prior Publication Data

US 2017/0263585 A1    Sep. 14, 2017

(30) Foreign Application Priority Data

Mar. 14, 2016    (JP) .................................. 2016-049686

(51) Int. Cl.
*H01L 23/00* (2006.01)
*H01L 21/66* (2006.01)
(Continued)

(52) U.S. Cl.
CPC .............. *H01L 24/81* (2013.01); *H01L 22/20* (2013.01); *H01L 24/03* (2013.01); *H01L 24/05* (2013.01);
(Continued)

(58) Field of Classification Search
None
See application file for complete search history.

(56) References Cited

U.S. PATENT DOCUMENTS 6,193,132 B1 * 2/2001 Shibata .................... B23K 3/04
228/103
8,409,919 B2    4/2013 Aoki et al.
(Continued)

FOREIGN PATENT DOCUMENTS

JP    H05-129371    5/1993
JP    2000-357713    12/2000
(Continued)

OTHER PUBLICATIONS

Taiwanese Office Action Aug. 29, 2017, filed in Taiwanese counterpart Patent Application No. 1061032.29, 17 pages (with English translation).

*Primary Examiner* — Kimberly Rizkallah
*Assistant Examiner* — Bo Bin Jang
(74) *Attorney, Agent, or Firm* — Patterson & Sheridan, LLP (57) ABSTRACT

A method for manufacturing an electronic component includes positioning a first surface of a first component facing a second surface of a second component in a first state. The first surface has a first pad having a first center. The second surface has a second pad having a second center. At least one of the first or second pads includes a metal member. The method includes melting the metal member and moving the first and second components until the melted metal member contacts both pads, moving at least one of the first or second components in a direction along the first surface, and solidifying the metal member in a second state. A first distance in a direction along the first surface between the first and second centers in the first state is longer than a second distance in the direction between the first and second centers in the second state.

20 Claims, 6 Drawing Sheets

(51) Int. Cl.
*H01L 25/065* (2006.01)
*H01L 25/00* (2006.01)

(52) U.S. Cl.
CPC .............. *H01L 24/13* (2013.01); *H01L 24/75* (2013.01); *H01L 25/0657* (2013.01); *H01L 25/50* (2013.01); *H01L 2224/03828* (2013.01); *H01L 2224/0401* (2013.01); *H01L 2224/13026* (2013.01); *H01L 2224/75745* (2013.01); *H01L 2224/75753* (2013.01); *H01L 2224/81121* (2013.01); *H01L 2224/81815* (2013.01); *H01L 2225/06506* (2013.01); *H01L 2225/06513* (2013.01); *H01L 2225/06541* (2013.01); *H01L 2924/3656* (2013.01)

(56) References Cited

U.S. PATENT DOCUMENTS

| | | | | |
|---|---|---|---|---|
| 2005/0098610 | A1* | 5/2005 | Onobori | B23K 1/0016 228/180.21 |
| 2006/0169746 | A1* | 8/2006 | Ozaki | H01L 24/75 228/101 |
| 2008/0277784 | A1* | 11/2008 | Ozaki | H01L 24/03 257/737 |
| 2012/0273942 | A1 | 11/2012 | Uchida | |

FOREIGN PATENT DOCUMENTS

| | | |
|---|---|---|
| JP | 2011-151322 | 8/2011 |
| JP | 4901933 B2 | 3/2012 |
| TW | 200731425 | 8/2007 |
| TW | 201205697 | 2/2012 |
| TW | 201521161 | 6/2015 |
| WO | 00019514 | 4/2000 |

\* cited by examiner

METHOD FOR MANUFACTURING ELECTRONIC COMPONENT AND MANUFACTURING APPARATUS OF ELECTRONIC COMPONENT

CROSS-REFERENCE TO RELATED APPLICATION

This application is based upon and claims the benefit of priority from Japanese Patent Application No. 2016-049686, filed Mar. 14, 2016, the entire contents of which are incorporated herein by reference.

FIELD

Embodiments described herein relate generally to a method for manufacturing an electronic component and a manufacturing apparatus for manufacturing an electronic component.

BACKGROUND

Generally, in an electronic component, for example, a component is connected to a substrate and the like by flip-chip connection and the like. Connections with lower resistance than that realized by standard flip-chip manufacturing are desired.

DETAILED DESCRIPTION

According to embodiment, there is provided a method for manufacturing an electronic component and a manufacturing apparatus for manufacturing the electronic component in which low resistance connections are able to be formed.

An embodiment of the method for manufacturing an electronic component includes positioning a first surface of a first component in facing relationship with a second surface of a second component in a first state. The first surface has a first pad having a first geometric center. The second surface has a second pad having a second geometric center. At least one of the first pad or the second pad includes a metal member thereon. The method further includes melting the metal member and moving the first component and the second component with respect to each other until the melted metal member contacts both the first pad and the second pad. The method further includes, after the melted metal member contacts both the first pad and the second pad, moving at least one of the first component or the second component in a direction along the first surface, and solidifying the metal member in a second state after moving at least one of the first component or the second component in the direction along the first surface. A first distance in a direction along the first surface between the first geometric center of the first pad in the first state and the second geometric center of the second pad in the first state is longer than a second distance in the direction along the first surface between the first geometric center in the second state and the second geometric center in the second state.

Hereinafter, each embodiment will be described with reference to the drawings.

The drawings are schematic or conceptual and a relationship between a thickness and a width of each portion, a size ratio between portions, and the like are not necessarily identical to those in reality. Even when describing the same portions, dimensions and ratios may be differently represented each other by drawing.

In this disclosure, the same elements as those previously described with reference to the drawings described already and detailed description will be appropriately omitted.

FIGS. 1A to 1G are schematic sectional views illustrating steps in a method for manufacturing an electronic component according to an embodiment.

Figure 2:
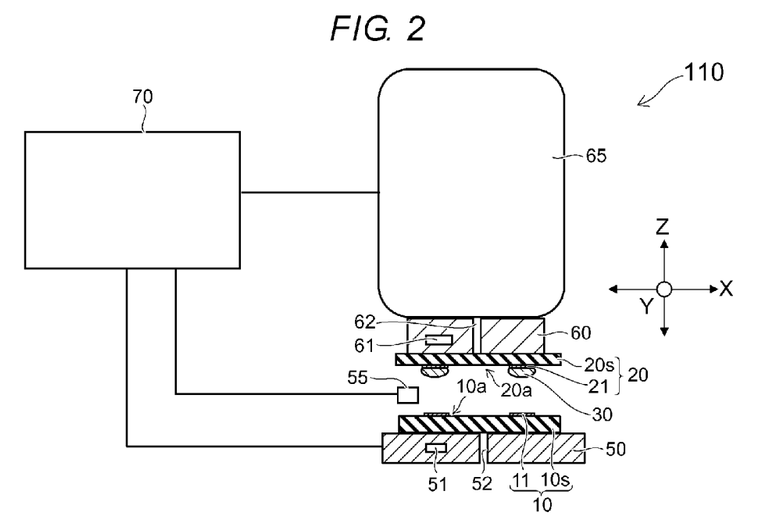
FIG. 2 is a schematic view illustrating a manufacturing apparatus of the electronic component according to the embodiment.

FIG. 2 is a schematic view illustrating a manufacturing apparatus of an electronic component according to the embodiment.

As illustrated in FIG. 2, a manufacturing apparatus 110 for manufacturing an electronic component according to the embodiment includes a stage 50, a head 60, and a control portion 70. The manufacturing apparatus 110 is, for example, a flip bonder.

A first component 10 is mounted on the stage 50. The first component 10 has a first surface 10a. A first pad 11 is provided in the first surface 10a. For example, a first substrate 10s is provided as the base of the first component 10 and the first pad 11 is provided on one surface (first surface 10a) of the first substrate 10s. In the example, a hole 52 is provided in the stage 50. Vacuum can be applied to the inside of the hole 52. The first component 10 is thus attracted to and fixed in place by the vacuum in the hole 52.

In the example, the stage 50 includes a first temperature control portion 51. The first temperature control portion 51 includes, for example, a ceramic heater, and the like. For example, the temperature of the first component 10 is controlled by the first temperature control portion 51.

The head 60 can hold a second component 20. The second component 20 has a second surface 20a. A second pad 21 is provided in the second surface 20a. For example, a second substrate 20s is provided as the base of the second component 20 and the second pad 21 is provided on one surface (second surface 20a) of the second substrate 20s.

For example, a hole 62 is provided in the head 60 and a vacuum can be applied inside of the hole 62. The second component 20 is attracted by the vacuum in the hole 62 and the second component 20 is thus held in place.

In the example, the head 60 includes a second temperature control portion 61. The second temperature control portion 61 includes, for example, a ceramic heater, and the like. For example, a temperature of the second component 20 is controlled by the second temperature control portion 61.

The second surface 20a of the second component 20 held by the head 60 faces the first surface 10a of the first component 10.

The head 60 is, for example, supported by a support portion 65. The support portion 65 is movable, whereby the position of the head 60 can be changed.

A perpendicular direction to an upper surface of the stage 50 is referred to as a Z-axis direction. One direction perpendicular to the Z-axis direction is referred to as an X-axis direction. A direction perpendicular to the Z-axis direction and the X-axis direction is referred to as a Y-axis direction.

The control portion 70 controls the relative position between the stage 50 and the head 60. The relative position includes a position in the Z-axis direction. The relative position includes at least one direction in the X-Y plane. The relative position may include, for example, a position in the X-axis direction and a position in the Y-axis direction.

The control portion 70 further controls the temperature of at least one of the stage 50 and the head 60. For example, the control portion 70 controls the first temperature control portion 51 and the second temperature control portion 61. Therefore, the temperature of the stage 50 and the temperature of the head 60 are controlled. Furthermore, the temperature of the first component 10 and a temperature of the second component 20 are controlled.

At least one of the first component 10 and the second component 20 has a metal member 30. The metal member 30 includes, for example, solder. The metal member 30 is changed from a solid state to a liquid state by controlling a temperature of at least one of the first component 10 and the second component 20. The metal member 30 is changed from the liquid state to the solid state by the control of the temperature. For example, if the temperature of the metal member 30 exceeds a melting point of the metal member 30, the metal member 30 is fused (melted) and the metal member 30 is in the liquid state. When the temperature of the metal member 30 is less than the melting point of the metal member 30, the metal member 30 is in the solid state.

In the example, the manufacturing apparatus 110 further includes an imaging portion 55 (for example, camera). For example, the relative positions of the first component 10 and the second component 20 is detected by the imaging portion 55 and then alignment is performed.

After the alignment, the first component 10 and the second component 20 approach each other with the metal member 30 therebetween. The metal member 30 is melted to the liquid state and the pads 11, 21 are positioned so that the metal member in the liquid state is in contact with both. Then the metal member 30 returned to the solid state. Therefore, the first component 10 and the second component 20 are joined together. The first pad 11 and the second pad 21 are electrically connected to each other by the metal member 30.

Hereinafter, an example of a method for manufacturing an electronic component using the manufacturing apparatus 110 will be described with reference to FIGS. 1A to 1G.

Figure 1A:
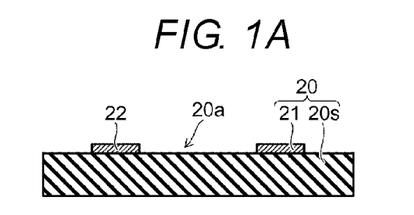
FIGS. 1A to 1G are schematic sectional views illustrating the steps of a method for manufacturing an electronic component according to an embodiment.

As illustrated in FIG. 1A, the second component 20 is prepared. The second component 20 has the second surface 20a on which the second pad 21 is provided. In the example, another pad 22 is further provided in the second surface 20a.

Figure 1B:
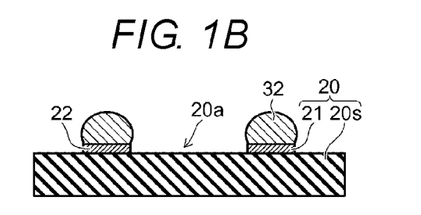

In the example, as illustrated in FIG. 1B, the metal members 30 (second metal members 32) in the solid state is provided in the second pad 21 (and the other pad 22). As described below, the metal member 30 may be provided on at least one of the first pad 11 and the second pad 21.

The metal member 30 is, for example, a bump (for example, solder bump). The metal member 30 includes solder. The solder includes, for example, tin. The metal member 30 may include an alloy of tin and other metals. Examples of the metal member 30 will be described herein.

Figure 1C:
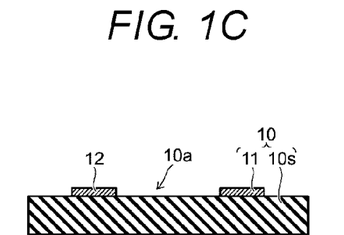

As illustrated in FIG. 1C, the first component 10 is prepared. The first component 10 has the first surface 10a on which the first pad 11 is provided. In the example, another pad 12 is further provided in the first surface 10a.

Figure 1D:
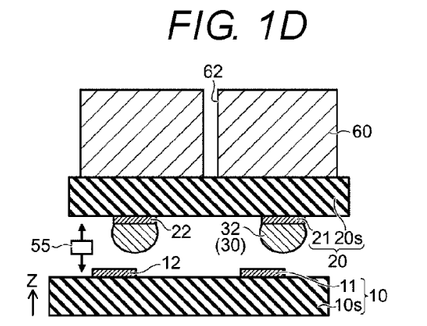

As illustrated in FIG. 1D, the second component 20 held by the head 60 is positioned above the first component 10 mounted on the stage 50 (not illustrated in FIG. 1D). The first surface 10a and the second surface 20a face each other. In this case, the metal member 30 in the solid state is provided in at least one of the first pad 11 and the second pad 21. In the example, the metal member 30 (second metal member 32) in the solid state is provided in the second pad 21.

For example, in a state (state where a distance between the stage 50 and the head 60 is long) of FIG. 1D, the relative position between the first component 10 and the second component 20 is detected by the imaging portion 55. The alignment between the first component 10 and the second component 20 is performed based on a detection result (information regarding the relative position) of the imaging portion 55. The alignment is performed by control (control of a position in an X-Y plane) of a position of at least one of the stage 50 and the head 60.

Figure 1E:
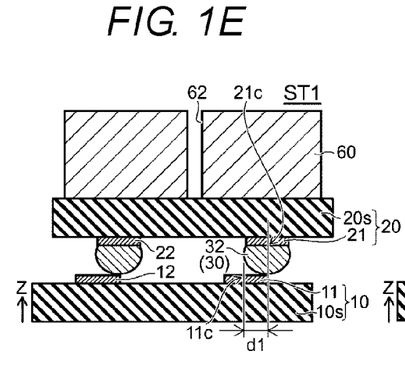

As illustrated in FIG. 1E, the imaging portion 55 is moved from the space between the first component 10 and the second component 20. Then, the first component 10 and the second component 20 approach each other via the metal member 30. For example, a position in the Z-axis direction is changed from the state of FIG. 1(d). The change of the position is performed by control of at least one of the stage 50 and the head 60. A state of FIG. 1E is referred to as a first state ST1. In the first state ST1, the metal member 30 in the solid state is provided in at least one of the first pad 11 and the second pad 21. When transition is performed from the state of FIG. 1D to the state of FIG. 1E, if a position in the X-Y direction is not substantially changed, the state of FIG. 1D may be the first state ST1.

As described above, in the embodiment, the first surface 10a of the first component 10 and the second surface 20a of the second component 20 face each other in the first state ST1 (state where the metal member 30 in the solid state is provided in at least one of the first pad 11 and the second pad 21) (first step, that is, a first operation).

The temperature of the metal member 30 in the first state ST1 is lower than the melting point thereof. For example, if the melting point of the metal member 30 is 200° C., the temperature of the metal member 30 in the first state ST1 is 50° C.

As illustrated in FIG. 1E, in the embodiment, a distance between a first geometric center 11c of the first pad 11 in the first state ST1 and a second geometric center 21c of the second pad 21 in the first state ST1 is referred to as a first distance d1. The first distance d1 is relatively large. That is, the alignment two pads are shifted off-center.

Figure 1F:
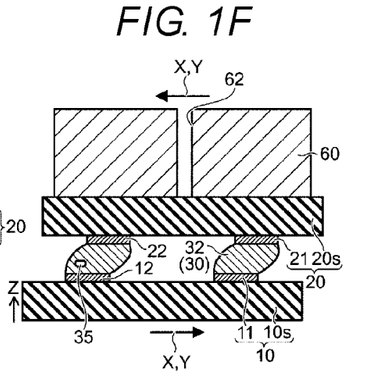

As illustrated in FIG. 1F, after the first step (first operation), the metal member 30 is melted. Then, the first surface 10a of the first component 10 and the second surface 20a of the second component 20 approach each other until the melted metal member 30 comes into contact with both the first pad 11 and the second pad 21. In a state where the melted metal member 30 comes into contact with the first pad 11 and the second pad 21, at least one of the first component 10 and the second component 20 is moved in the plane of the first surface 10a (second step, that is, second operation). In the second step (second operation), for example, the first component 10 is held in the head 60 and the first component 10 is moved in the plane of the first surface 10a. For example, if the melting point of the metal member 30 is 200° C., the temperature of the metal member 30 is 250° C. in the second step. The melting temperature of the metal member 30 is less than that of the underlying material of the pad 11, 21.

The melting described above is performed by controlling at least one of the stage 50 and the head 60 by the control portion 70. For example, the movement in the plane of surface 10s is performed in the X-Y plane. The movement described above is performed in a direction having a component of at least one of the X-axis direction and the Y-axis direction. The movement is performed by controlling the position of at least one of the stage 50 and the head 60 by the control portion 70.

Therefore, a relative positional relationship between the first component 10 and the second component 20 is in a state different from the first state ST1.

Figure 1G:
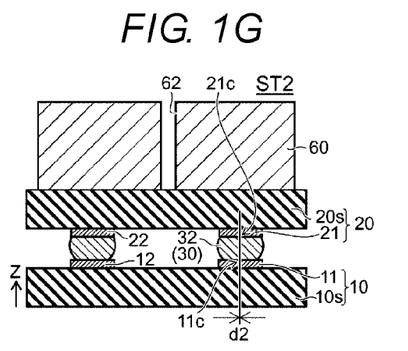

As illustrated in FIG. 1G, after the second step (second operation), the metal member 30 is returned to the solid state. A second state ST2 in which the first pad 11 and the second pad 21 are electrically connected to each other by the melted metal member 30 is formed (third step, that is, third operation). In the third step, for example, the relative positional relationship between the first component 10 and the second component 20 that is moved by the second step is substantially maintained. For example, if the melting point of the metal member 30 is 200° C., the temperature of the metal member 30 is returned to 100° C. in the third step.

As illustrated in FIG. 1G, in the second state ST2, a relative distance between the geometric centers of the two pads has been reduced compared to that in the first state ST1. A distance along the first surface 10a between the first geometric center 11c in the second state ST2 and the second geometric center 21c in the second state is referred to as a second distance d2. The second distance d2 is shorter than the first distance d1. In other words, the first distance d1 is longer than the second distance d2.

That is, in the embodiment, in the first state ST1 before the metal member 30 is melted (FIG. 1E), for example, the first pad 11 and the second pad 12 are shifted from the predetermined alignment positions. Shifted alignment is performed. Then, after the metal member 30 is melted, the two components are relatively moved in the X-Y plane. Thereafter, the metal member 30 is returned to the solid state. The relative positions of the geometric centers 11c, 21c of the pads 11, 21 are changed from the position of the shifted or offset alignment and thus the positional relationship between the first pad 11 and the second pad 21 is close to a predetermined relationship (design position).

As illustrated in FIG. 1F, in a state where the metal member 30 is in a liquid state, it is found that a void 35 may occur. If the metal member 30 is in the solid state while the void 35 remains, the current path in an electrical connection between the first pad 11 and the second pad 21 is narrowed. Therefore, electrical resistance of the connection is increased. It is found that such a void 35 particularly easily occurs, for example, if the pad is recessed (described below).

According to experiments performed by the present inventors, it is found that an increase in a resistance value is suppressed if the first component 10 and the second component 20 are relatively moved in a state where the metal member 30 is in the liquid state. It is considered that the void 35 is eliminated or the volume of the void 35 is reduced by the relative movement.

In this case, if the alignment of a final target position (design position) is performed in the state (first state ST1) before the metal member 30 is melted, thereafter, if the component is the relatively moved in a state where the metal member 30 has been melted to the liquid state, the final relative position of the pads is shifted from the design position of the target position.

On the other hand, in the embodiment, for example, in a state (first state ST1) before the metal member 30 is fused, the alignment between the pads 11, 21 is shifted from a predetermined position. Therefore, thereafter, the position is close to the predetermined, designed alignment, position after the movement of the component when the metal member 30 is in the liquid state. Therefore, for example, the connection is completed in the design position.

In the embodiment, after the electrical connection is completed, occurrence of the void 35 is suppressed. Therefore, it is possible to provide the method for manufacturing an electronic component in which the connection of low resistance can be performed using the manufacturing apparatus of the electronic component.

There is a reference example in which, for example, vibration (ultrasonic and the like) is applied during joining. In the reference example, the vibration is applied to the metal member 30 in a liquid state. In such a reference example, the first distance d1 is substantially equal to the second distance d2. If the vibration is applied, suppression of the void 35 is not sufficient. In the embodiment, the first distance d1 between the first component 10 and the second component 20 in the first state ST1 can be greater than a distance obtained by the vibration and the like. Therefore, the suppression of the void 35 is effectively obtained.

In the embodiment, the movement (relative movement between the first component 10 and the second component 20 in a state where the metal member 30 is in the liquid state) in the second step illustrated in FIG. 1F may be performed, for example, based on information regarding the relative position between the first component 10 and the second component 20 in the first state ST1. The movement in the second step (second operation) may be executed, for example, based on information obtained by the imaging portion 55 obtaining the information regarding the positions of the first component 10 and the second component 20.

Hereinafter, examples of the first component 10 and the second component 20 will be described.

FIGS. 3A to 3D are schematic sectional views illustrating the component used in the method for manufacturing an electronic component according to the embodiment.

Figure 3A:
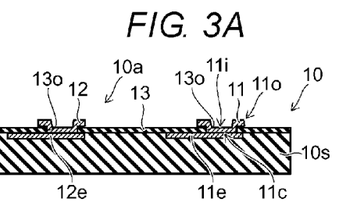
FIGS. 3A to 3D are schematic sectional views illustrating a component used in the method for manufacturing the electronic component according to the embodiment.

As illustrated in FIG. 3A, in the first component 10, for example, wiring 11e and wiring 12e are provided on the first substrate 10s. An insulating layer 13 having an opening 13o is provided on a portion of the wirings. For example, the first pad 11 is provided on the wiring 11e and exposed in the opening 13o in a portion of the insulating layer 13. The other pad 12 is provided on the wiring 12e and exposed in the opening 13o in another portion of the insulating layer 13.

In the example of FIG. 3A, the first pad 11 is recessed. For example, the first pad 11 includes a first center region 11i and a first outer periphery region 11o. The first center region 11i includes the first geometric center 11c of the first pad 11. The first outer periphery region 11o is provided around the first center region 11i. The first center region 11i is recessed from the first outer periphery region 11o. In such a recessed pad, the void 35 easily occurs. Particularly, if flux is used, the occurrence of the void 35 is further increased.

Figure 3B:
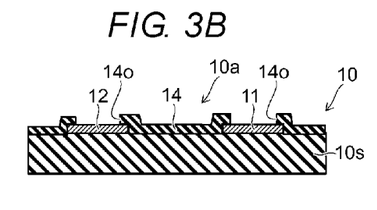

As illustrated in FIG. 3B, in the first component 10, for example, conductive layers respectively formed of the first pad 11 and the other pad 12 are provided on the first substrate 10s. An insulating layer 14 having an opening 14o is provided on a portion of the conductive layers. In this case, a plane shape of the first pad 11 corresponds to a plane shape of the conductive layer exposed in the opening 14o of the insulating layer 14. That is, the plane shape of the first pad 11 becomes the plane shape of the opening 14o of the insulating layer 14 provided over a portion of the first pad 11. The same applies to the other pad 12.

Figure 3C:
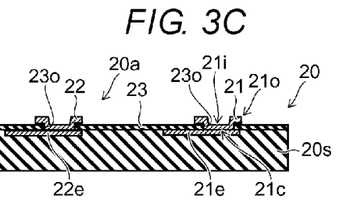

As illustrated in FIG. 3C, in the second component 20, for example, wiring 21e and wiring 22e are provided on the second substrate 20s. An insulating layer 23 having an opening 23o is provided over a portion of the wirings. For example, the second pad 21 is provided on the wiring 21e and exposed in the opening 23o in a portion of the insulating layer 23. The other pad 22 is provided on the wiring 22e exposed in the opening 23o and another portion of the insulating layer 23.

In the example of FIG. 3C, the second pad 21 is recessed. For example, the second pad 21 includes a second center region 21i and a second outer periphery region 21o. The second center region 21i includes the second geometric center 21c of the second pad 21. The second outer periphery region 21o is provided around the second center region 21i. The second center region 21i is recessed from the second outer periphery region 21o. In such a recessed pad, the void 35 easily occurs.

Figure 3D:
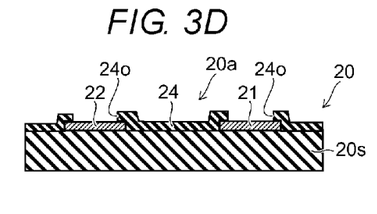

As illustrated in FIG. 3D, in the second component 20, for example, the conductive layers respectively formed of the second pad 21 and the other pad 22 are provided on the second substrate 20s. An insulating layer 24 having an opening 24o is provided over a portion of the conductive layers. In this case, the plane shape of the second pad 21 corresponds to the plane shape of the conductive layer exposed in the opening 24o of the insulating layer 24. That is, the plane shape of the second pad 21 becomes the plane shape of the opening 24o of the insulating layer 24 provided over a portion of the second pad 21. The same applies to the other pad 22.

FIGS. 4A to 4D are schematic plan views illustrating the component used in the method for manufacturing the electronic component according to the embodiment.

The drawings illustrate the plane shape of the pad.

Figure 4A:
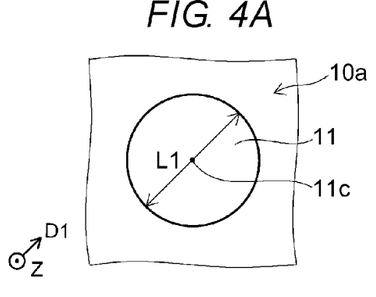
FIGS. 4A to 4D are schematic plan views illustrating a component used in the method for manufacturing the electronic component according to the embodiment.
Figure 4B:
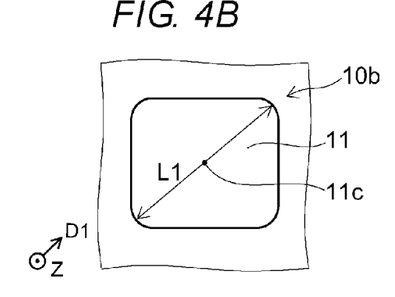
Figure 4C:
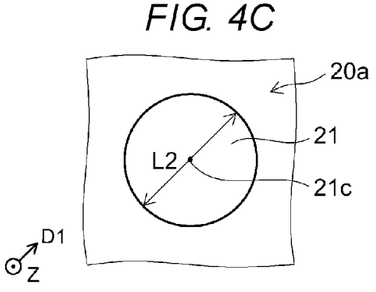
Figure 4D:
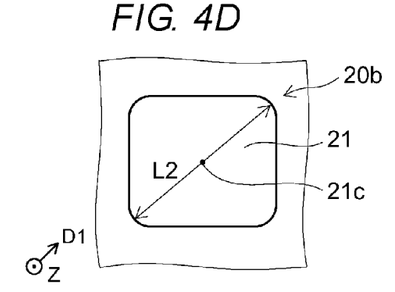

As illustrated in FIGS. 4A and 4B, the plane shape of the first pad 11 is, for example, a shape viewed from the Z-axis direction. As illustrated in FIGS. 4C and 4D, the plane shape of the second pad 21 is, for example, a shape viewed from the Z-axis direction. The plane shape includes, for example, a circular shape (flat round shape). The plane shape includes, for example, a substantially quadrangle shape (including square, rectangular, and the like). Corner portions may be curved.

The geometric centers of the plane shapes become the first geometric center 11c and the second geometric center 21c.

For example, the movement in the second step (second operation), is performed along a direction (moving direction D1 along the X-Y plane) perpendicular to the Z-axis direction. A maximum value of a length across the plane shape of the first pad 11 along the moving direction D1 is referred to as a first length L1. A maximum value of a length across the plane shape of the second pad 21 along the moving direction D1 is referred to as a second length L2.

Hereinafter, an example of the distance of the movement in the second step (second operation) illustrated in FIG. 1F will be described.

Figure 5:
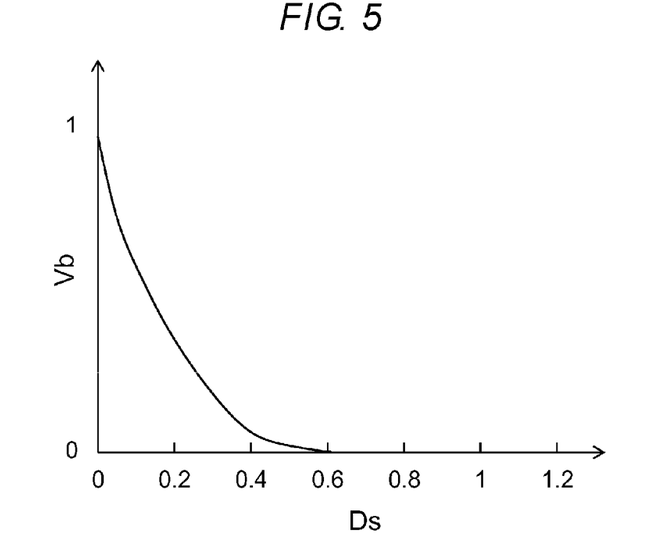
FIG. 5 is a graph illustrating the method for manufacturing the electronic component according to the embodiment.

FIG. 5 is a graph illustrating the method for manufacturing an electronic component according to the embodiment.

A horizontal axis of FIG. 5 is a distance Ds (relative value) of the movement in the second step (second operation). The movement is performed along the moving direction D1 along the X-Y plane. The distance Ds is normalized by an average value of the first length L1 (maximum value of the length of the first pad 11 along the moving direction D1 of the plane shape) and the second length L2 (maximum value of the length of the second pad 21 in the moving direction D1 of the plane shape). The average value is (L1+L2)/2. That is, the distance Ds (relative value) is ("distance (absolute value) of the movement"/"average value"). In the example, the plane shapes of the first pad 11 and the second pad 21 are the circular shape and sizes of the circles are equal to each other.

As illustrated in FIG. 5, if the distance Ds is increased, a volume Vb of the void 35 is reduced. If the distance Ds is equal to or greater than 0.6, the void 35 does not meaningfully occur. If the distance Ds is equal to or greater than 0.1, the volume Vb of the void 35 is effectively reduced. The volume Vb is reduced, whereby low resistance is obtained.

On the other hand, the distance Ds is close to 1, for example, the connection between the metal member 30 and the pad tends to be difficult. For example, if the distance Ds is equal to or less than 0.9, a good connection is easily obtained. Furthermore, if the distance Ds is equal to or less than 0.8, a good connection is further easily obtained.

In the embodiment, it is preferable that the distance of the movement in the second step (second operation) is, for example, equal to or greater than 10% and equal to or less than 90% of the average value (arithmetic mean) of the first length L1 (maximum value of the length of the first pad 11 along the moving direction D1 of the plane shape) and the second length L2 (maximum value of the length of the second pad 21 in the moving direction D1 of the plane shape). For example, it is further preferable that the distance of the movement is equal to or greater than 25% and equal to or less than 75% of the average value. A low resistance and good connection are obtained. For example, it is further preferable that the distance of the movement is equal to or greater than 40% and equal to or less than 60% of the average value.

In the embodiment, the size of the first pad 11 may be different from the size of the second pad 21.

In the embodiment, the occurrence of the void 35 is suppressed. Therefore, for example, reliability can be improved. The occurrence of the void 35 is suppressed and thereby, for example, resistance heating of the resulting device can be suppressed and good operation characteristics are easily obtained.

Figure 6A:
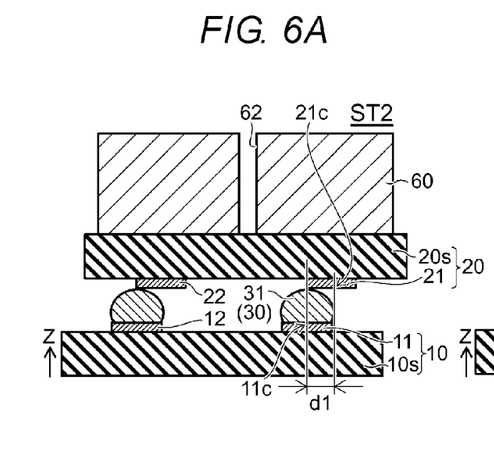
FIGS. 6A to 6C are schematic sectional views illustrating steps in a method for manufacturing the electronic component according to the embodiment.
Figure 6B:
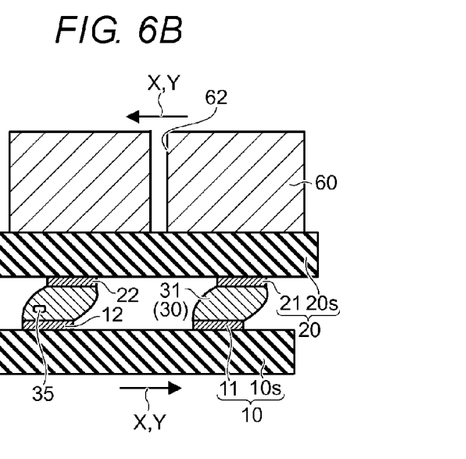
Figure 6C:
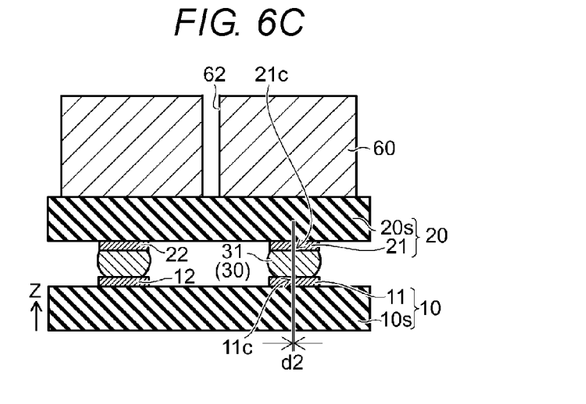

FIGS. 6A to 6C are schematic sectional views illustrating a method for manufacturing an electronic component according to an embodiment.

As illustrated in FIG. 6A, in the example, a metal member 30 (first metal member 31) is provided in a first pad 11 of a first component 10. As illustrated in FIG. 6A, a first surface 10a of the first component 10 and a second surface 20a of a second component 20 face each other in a first state ST1 (state where the metal member 30 of the solid state is provided in the first pad 11) (first step, that is, a first operation).

A distance (first distance d1) between a first geometric center 11c of a plane shape of the first pad 11 in the first state ST1 and a second geometric center 21c of a plane shape of a second pad 21 in the first state ST1 is relatively large.

As illustrated in FIG. 6B, after the first step (first operation), the metal member 30 is melted. In a state where the melted metal members 30 come into contact with the first pad 11 and the second pad 21, at least one of the first component 10 and the second component 20 is moved along the first surface 10a(second step, that is, a second operation).

As illustrated in FIG. 6C, after the second step (second operation), after moving the pads into alignment, the metal member 30 is returned to the solid state. A second state ST2 in which the first pad 11 and the second pad 21 are electrically connected to each other by the metal member 30 in the solid state is formed (third step, that is, a third operation).

As illustrated in FIG. 6C, a second distance d2 in a direction along the first surface 10a between the first geometric center 11c in the second state ST2 and the second geometric center 21c in the second state ST2 is shorter than the first distance d1. In other words, the first distance d1 is longer than the second distance d2. Therefore, the void 35 is suppressed. Therefore, a connection of a low resistance can be obtained.

Figure 7A:
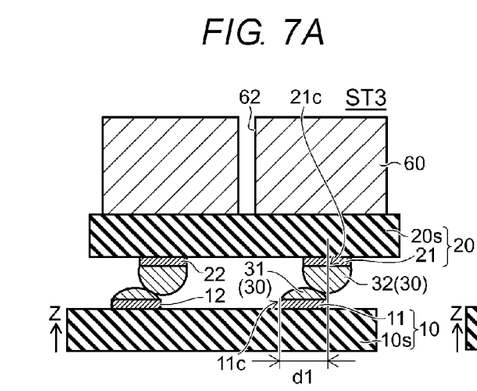
FIGS. 7A to 7C are schematic sectional views illustrating steps in a method for manufacturing the electronic component according to the embodiment.
Figure 7B:
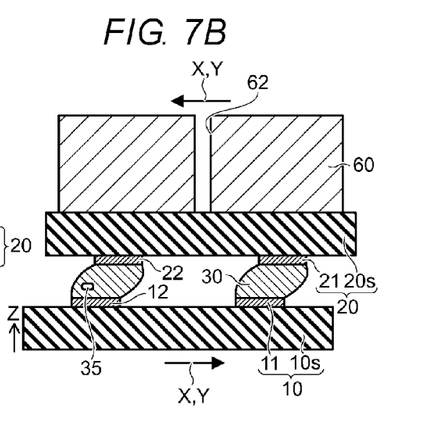
Figure 7C:
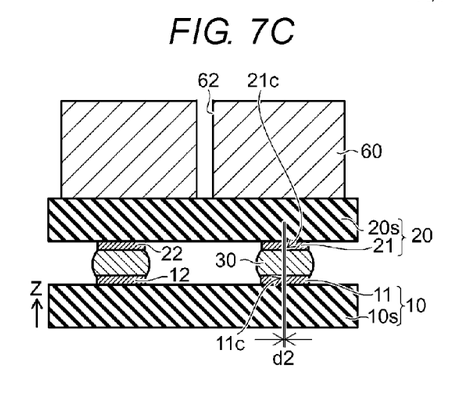

FIGS. 7A to 7C are schematic sectional views illustrating a method for manufacturing an electronic component according to an embodiment.

As illustrated in FIG. 7A, in the example, a first metal member 31 that is a portion of a metal member 30 is provided on a first pad 11 of a first component 10. A second metal member 32 that is another portion of the metal member 30 is provided on a second pad 21 of the second component 20. Also in this case, the same first to the third steps (first to third operations) as those of FIGS. 6A to 6C are executed. A void 35 is suppressed. Therefore, a connection of a low resistance can be obtained.

As described above, in the embodiment, in the first state ST1, the metal member 30 includes the bump (the first metal member 31 or the second metal member 32) provided in any one of the surface of the first pad 11 and the surface of the second pad 12 (see FIGS. 1E and 6A).

In the embodiment, in the first state ST1, the metal member 30 may include a first bump (first metal member 31) provided on the surface of the first pad 11 and a second bump (second metal member 32) provided on the surface of the second pad 21 (see FIG. 7A).

Hereinafter, the example of the first component 10 and the second component 20 will be described again with reference to FIGS. 1A to 1G.

For example, a semiconductor wafer of 12 inches diameter as the second substrate 20s is prepared. Pads (the second pad 21 and the like) are formed on the semiconductor wafer. For example, a seed layer (metal film) such as Ti/Cu is formed on a surface of a semiconductor chip (for example, the second substrate 20s) of the semiconductor wafer, for example, by sputtering and the like. A thickness of a Ti film is, for example, equal to or greater than 0.03 μm and equal to or less than 0.5 μm. A thickness of a Cu film is, for example, equal to or greater than 0.1 μm and equal to or less than 1.0 μm. The seed layer may include at least one of Ti, Cu, Ni, Cr, Au, and Pd. The seed layer may include an alloy containing 2 pairwise of the metals. The pad may include a composite film containing a plurality of films of the metals. A resist (thickness is approximately 80 μm) is formed on the metal film that becomes the pad and is processed into a predetermined shape. For example, an opening (for example, a diameter is 100 μm) is formed in a position corresponding to an Al pad (not illustrated) provided in the semiconductor chip. A Cu film (thickness is equal to or greater than 1 μm and equal to or less than 10 μm, for example, 5 μm) is formed in the opening portion, for example, by electroplating. For example, the Cu film becomes the second pad 21.

For example, a solder layer (for example, a thickness is approximately 50 μm) is formed on the Cu film by electroplating. For example, the resist is peeled and the seed layer (Ti/Cu) is etched. Etchant of Cu contains, for example, sulfuric acid and $H_2O_2$. In etchant of Ti, for example, KOH is added to HF or $H_2O_2$. After applying flux to the solder formed by electroplating, reflow is performed. Therefore, the metal member 30 (second metal member 32) is obtained (FIG. 1B).

The metal member 30 includes, for example, the solder. The solder includes, for example, at least one of Sn, Pb, Ag, Cu, Ni, Au, Bi, In, Sb, Ge, and Zn. The metal member 30 may include an alloy containing two or more of the elements. The metal member 30 may include two or more composite films of the elements.

In the embodiment, the second pad 21 may be formed on the Al pad of the semiconductor chip by electroless plating. For example, the metal film of Ni/Pd/Au is formed by electroless plating. A thickness of the Ni film is, for example, equal to or greater than 1 μm and equal to or less than 5 μm. A thickness of the Pd film is, for example, equal to or greater than 0.01 μm and equal to or less than 1 μm. A thickness of the Au film is, for example, equal to or greater than 0.01 μm and equal to or less than 3 μm.

The metal member 30 (bump) may be formed by mounting solder balls on the pad (for example, the second pad 21). The metal member 30 (bump) may be formed by printing solder paste onto the pad (for example, the second pad 21). For formation of the pad (second pad 21) formed on the Al pad of the semiconductor chip, for example, at least one of electroplating method, vapor deposition method, and sputtering method may be used.

As illustrated in FIG. 1C, the first substrate 10s (first component 10) on which the first pad 11 is formed is prepared. The first pad 11 contains, for example, at least one of Cu, Ni, Au, Pd, and Ag. The first pad 11 may include an alloy containing two or more of the elements. The first pad 11 may include two or more composite films of the elements. The first pad 11 may include a stacked film containing two or more of the elements.

The first substrate 10s (first component 10) may include, for example, at least one of a silicon substrate, a resin substrate, and a ceramic substrate. The first substrate 10s (first component 10) may include the semiconductor chip.

As illustrated in FIGS. 1D to 1G, in the second component 20, a flip chip is mounted on the first component 10, for example, by a flip bonder (manufacturing apparatus 110). Before mounting, flux may be applied to at least one of the metal member 30, the first pad 11, and the second pad 21.

For example, the solder bump (the second metal member 32) of the second component 20 (for example, the semiconductor chip) and the first pad 11 of the first component 10 are aligned. Thereafter, at least one of the first component 10 and the second component 20 is moved (shifted) by a predetermined amount. A load may be applied during mounting. In this state (FIG. 1D and FIG. 1E), the metal member 30 is in the solid state.

Thereafter, the temperature of at least one of the head 60 and the stage 50 is increased. Therefore, the temperature of the metal member 30 is brought higher than the melting point of the metal member 30. Thus, the metal member 30 is melted. In this case, the distance between the first component 10 and the second component 20 may be substantially constant by controlling the position in the Z-axis direction.

At least one of the head 60 and the stage 50 is relatively moved. In a state where the metal member 30 is melted, the relative positional relationship between the head 60 and the stage 50 is changed. That is, the relative position is moved (see FIG. 1F). The relative position is moved in a state where the metal member 30 is melted, whereby the formation of the solder bump is stabilized.

Thereafter, the temperature of at least one of the head 60 and the stage 50 is lowered. Therefore, the first pad 11 and the second pad 21 are electrically connected to each other by the metal member 30 (see FIG. 1G).

In the electronic component manufactured by such a method, occurrence of the void 35 is suppressed. An electrical connection portion of the electronic component is observed, for example, by an X-ray inspection apparatus. For example, the void 35 is not substantially observed.

At least a portion of air, flux component, and the like included in the recessed portion of the pad is considered to be removed by mounting the second component 20 shifted from a predetermined position on the first component 10 and then moving the second component 20. Therefore, the occurrence of the void 35 is considered to be suppressed.

In the embodiment, after the state of being illustrated in FIG. 1G, the portion between the second component 20 and the first component 10 may be filled with resin. For example, the portion is filled with under-fill resin. For example, the portion is filled with mold resin. After underfill, an entire chip may be further covered by the mold resin.

In the electronic component (for example, a semiconductor device) manufactured by the steps described above, high reliability is obtained. For example, in a temperature cycle test, a temperature change from −55° C. (30 min) to 25° C. (5 min) to 125° C. (30 min) is one cycle. In the electronic component, the occurrence of breakage is not observed in the connection portion after 3,000 cycles.

In the example of FIGS. 1A to 1G, for example, the solder bumps are provided on the semiconductor chip side, the pads are provided on the substrate side, and the flip chip connection is performed.

In the example of FIGS. 6A to 6C, for example, the pads are provided on the semiconductor chip side, the solder bumps are provided on the substrate side, and the same process is performed.

In the example of FIGS. 7A to 7C, the solder bumps are provided on both the semiconductor chip side and the substrate side, and the same process is performed.

As described above, for example, at least one of the first pad 11 of the first component 10 and the second pad 21 of the second component 20 may be recessed. In a case of being recessed, even if an amount of the metal member 30 (for example, solder) is changed, good connection is easily obtained. On the other hand, in the case of being recessed, the void 35 easily occurs. In the embodiment, even if the pad is recessed, it is possible to suppress the occurrence of the void 35.

If the pad is recessed, a depth of the recessed portion is equal to or greater than 0.5 μm and equal to or less than 50 μm. If the depth is equal to or greater than 0.5 μm, an allowable width of the variation in the amount of the metal member 30 (for example, solder) can be increased. If the depth exceeds 50 μm, stable connection is unlikely to be obtained.

Figure 8A:
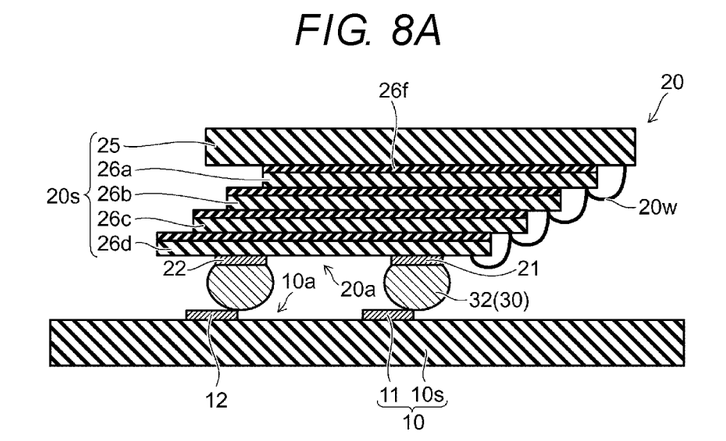
FIGS. 8A and 8B are schematic sectional views illustrating steps in a method for manufacturing the electronic component according to the embodiment.
Figure 8B:
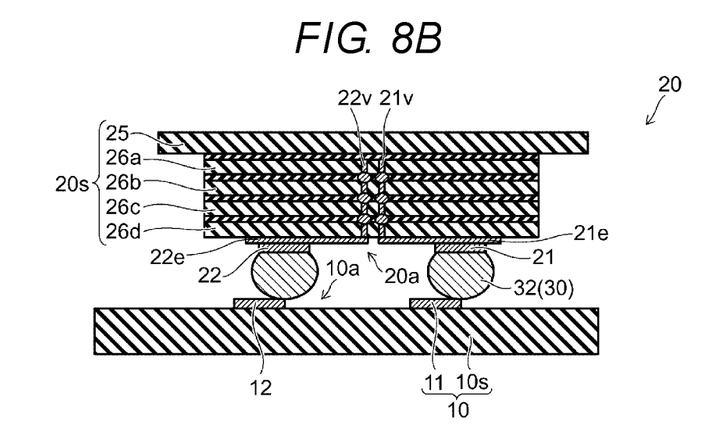

FIGS. 8A and 8B are schematic sectional views illustrating a method for manufacturing an electronic component according to an embodiment.

As illustrated in FIG. 8A, in the example, a second component 20 includes a plurality of stacked semiconductor chips (semiconductor chips 26a to 26d). For example, the semiconductor chips 26a to 26d are stacked on a surface of a substrate 25. The semiconductor chips 26a to 26d are electrically connected to each other by a wire 20w. Resin films 26f and the like may be provided any between the semiconductor chips 26a to 26d. Resin of a liquid state provided between any of the semiconductor chips 26a to 26d and cured may be used. For example, the solder bump (metal member 30) is formed in the semiconductor chip (semiconductor chip 26d in the example) of the uppermost layer.

Also in the example, the same steps as the steps described in FIGS. 1D to 1G are performed.

As illustrated in FIG. 8B, in the example, a second substrate 20s includes the plurality of stacked semiconductor chips (semiconductor chips 26a to 26d). The second component 20 includes a via conductive portion 21v (via conductive portion 22v) provided in the second substrate 20s. The via conductive portion 21v is electrically connected to the second pad 21. The via conductive portion 22v is electrically connected to the other pad 22.

For example, the semiconductor chips (semiconductor chips 26a to 26d) including through electrodes (via conductive portion 21v and the via conductive portion 22v) are provided on a surface of the substrate 25. Resin may be provided between the plurality of semiconductor chips. The through electrodes (via conductive portions 21v and 22v, and the like) may contain at least one of Cu, Ni, Au, Ag, and solder. The through electrodes may pass through only the semiconductor portion (for example, only silicon). In the example, the plurality of semiconductor chips may be connected to each other by the bump.

In the example of FIGS. 8A and 8B, the semiconductor chip may include, for example, at least one of a memory chip, a controller chip, a system LSI, an analog IC, a digital IC, a discrete semiconductor, and an optical semiconductor.

Also in those examples, in the temperature cycle test described above, the occurrence of breakage is not observed in the connection portion after 3,000 cycles.

Figure 9:
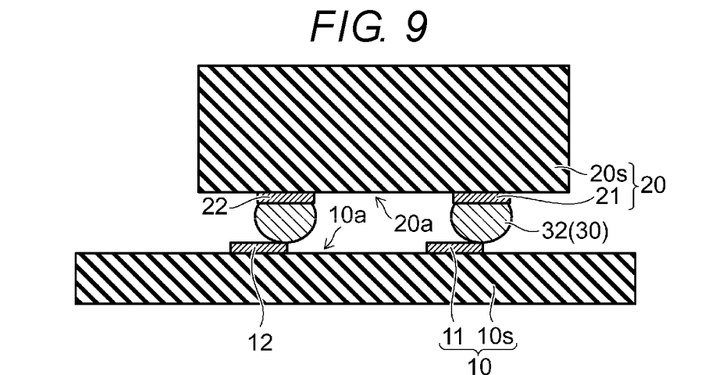
FIG. 9 is a schematic sectional view illustrating a step in a method for manufacturing the electronic component according to the embodiment.

FIG. 9 is a schematic sectional view illustrating a method for manufacturing an electronic component according to an embodiment.

In the example illustrated in FIG. 9, a second component 20 is a semiconductor package. A second pad 21 is provided on a surface (second surface 20a) of the semiconductor package. The second component 20 (the semiconductor package) is, for example, a Wafer Level Chip Size Package (Wafer Level CSP) of a fan-in type. The second component 20 (the semiconductor package) may be, for example, a Wafer Level CSP of a fan-out type.

Also in the example, the same steps as the steps described in FIGS. 1D to 1G are performed. In the temperature cycle test described above, the occurrence of breakage is not observed in the connection portion after 3,000 cycles.

In the above description, the first component 10 and the second component 20 may be replaced with each other.

As described above, at least one of the first component 10 and the second component 20 may include at least one of a silicon substrate, a resin substrate, and a ceramic substrate. At least one of the first component 10 and the second component 20 may include the plurality of stacked semiconductor chips. At least one of the first component 10 and the second component 20 may include the substrates (first substrate 10s, the second substrate 20s, and the like) and the via conductive portions (via conductive portion 21v, the via conductive portion 22v, and the like). At least one of the first component 10 and the second component 20 may include the semiconductor package. At least one of the first component 10 and the second component 20 may be a non-active component such as a resistance element, a filter element, a capacitor electrode, or a coil element.

For example, when connecting the solder bump of the semiconductor chip and the pad of the substrate, the void 35 may occur in the solder bump. Particularly, if the flux is used, the occurrence of the void 35 is increased. In the embodiment, for example, the solder bump and the pad are mounted in a shifted alignment state and then are moved in the plane of the pads. For example, in a state where the solder is melted, the solder is moved to a predetermined mounting position. Therefore, the occurrence of the void 35 is suppressed. The formation of the bump is stabilized. For example, reliability is improved in the temperature cycle test.

According to the embodiment, it is possible to provide the method for manufacturing an electronic component in which the connection of low resistance can be performed and the manufacturing apparatus of the electronic component.

In the disclosure, "perpendicular" and "parallel" refer to not only strictly perpendicular and strictly parallel, but also include, for example, variations in the manufacturing, and may be substantially perpendicular and substantially parallel.

The above embodiments are described with reference to the specific examples. However, the embodiments are not limited to the specific examples. For example, regarding a specific configuration of each element of the stage, the head, and the control portion included in the manufacturing apparatus of the electronic component, and the first component, the second component, the metal member, and the like used in the method for manufacturing the electronic component, those skilled in the art of the embodiments carry out in the same manner by appropriately selecting the configuration from the known range. The configuration is included in the scope of the embodiment as long as the same effect can be obtained.

In addition, a combination of any two or more elements of each specific example within an extent of technical feasibility includes in the scope of the embodiment as long as including the scope of the embodiment.

Other methods for manufacturing an electronic component and manufacturing apparatuses of the electronic component of which designs are appropriately changed based on the method for manufacturing the electronic component and the manufacturing apparatus of the electronic component as the embodiments herein are included in the scope of the embodiment as long as they include the scope of the embodiment.

Those skilled in the art can conceive various modification examples and changed examples in the spirit of the embodiment, and it is understood that the modification examples and the changed examples are included in the scope of the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing an electronic component, comprising:
    positioning a first surface of a first component in a facing relationship with a second surface of a second component in a first state, wherein the first surface has a first pad having a first geometric center, wherein the second surface has a second pad having a second geometric center, and wherein at least one of the first pad or the second pad includes a metal member thereon;
    melting the metal member and moving the first component and the second component with respect to each other until the melted metal member contacts both the first pad and the second pad;
    after the melted metal member contacts both the first pad and the second pad, moving at least one of the first component or the second component in a direction along the first surface based on detection of a relative position of the first component and the second component; and
    solidifying the metal member in a second state after moving at least one of the first component or the second component in the direction along the first surface,
    wherein a first distance in the direction along the first surface between the first geometric center of the first pad in the first state and the second geometric center of the second pad in the first state is longer than a second distance in the direction along the first surface between the first geometric center of the first pad in the second state and the second geometric center of the second pad in the second state, wherein the melted metal member includes a void before moving at least one of the first component or the second component in the direction along the first surface, and a volume of the void is reduced by moving at least one of the first component or the second component in the direction along the first surface.

2. The method according to claim 1,
    wherein in the first state, the metal member includes a bump provided on a surface of the first pad or a surface of the second pad.

3. The method according to claim 1,
    wherein the first pad is recessed within a first outer edge region of the first component located adjacent to the first pad.

4. The method according to claim 1,
    wherein one of the first component or the second component is moved a distance in the direction along the first surface when moving at least one of the first component or the second component, and
    wherein the moved distance is equal to or greater than 10% and equal to or less than 90% of an average value of a maximum value of a length of the first pad along the moving direction and a maximum value of the length of the second pad along the moving direction.

5. The method according to claim 1, further comprising:
    holding the first component in a head and moving the first component along the first surface when moving at least one of the first component or the second component.

6. The method according to claim 1, wherein the first component is the uppermost substrate of a plurality of stacked substrates.

7. The method according to claim 1, wherein the metal member is provided on one of the first pad or the second pad prior to the first state.

8. The method according to claim 1, wherein the first component comprises a semiconductor package.

9. A method of electrically connecting a first substrate and a second substrate, wherein the first substrate has a first conductive pad thereon, the first conductive pad comprising a generally planar surface having a center, and the second substrate has a second conductive pad thereon, the second conductive pad comprising a generally planar surface having a center, said method comprising:
providing a metal member having a lower melting temperature than the material of the first conductive pad and the second conductive pad on at least one of the first conductive pad or the second conductive pad;
locating the first conductive pad on the first substrate in a facing relationship with the second conductive pad on the second substrate, wherein the center of the first conductive pad is offset from the center of the second conductive pad in a direction of the planar surface of one of the first conductive pad or the second conductive pad by a first distance;
melting the metal member;
moving the first and second substrates relative to each other to bring the metal member in the melted state into contact with both the first and the second conductive pads; and
moving the first and second substrates relative to each other, based on detection of a relative position of the first substrate and the second substrate, in the direction of the planar surface of one of the first conductive pad or the second conductive pad and returning the metal member to a solid state, wherein
when the metal member returns to the solid state, the distance between the center of the first conductive pad and the center of the second conductive pad is a second distance, and the second distance is less than the first distance, and the melted metal member includes a void before moving the first and second substrates relative to each other in the direction of the planar surface of one of the first conductive pad or the second conductive pad, and a volume of the void is reduced by moving the first and second substrates relative to each other in the direction of the planar surface of one of the first conductive pad or the second conductive pad.

10. The method of claim 9, further comprising:
providing a first insulating layer on the first substrate; and
providing an opening in the first insulating layer, wherein the first conductive pad is exposed therein.

11. The method of claim 10, wherein the first conductive pad is recessed in the opening in the first insulating layer.

12. The method of claim 11, further comprising:
providing a flux on the first conductive pad; and
locating the metal member on the second conductive pad before locating the first conductive pad on the first substrate in the facing relationship with the second conductive pad on the second substrate.

13. The method according to claim 12, wherein the first substrate is a resin substrate.

14. The method of claim 10, further comprising:
providing a second insulating layer on the second substrate; and
providing an opening in the second insulating layer wherein the second conductive pad is exposed therein.

15. The method of claim 14, wherein at least one of the first conductive pad or the second conductive pad are recessed within the first or second insulating layer by at least 0.5 µm and no more than 50 µm.

16. A method of electrically connecting a first substrate and a second substrate, wherein the first substrate has a first conductive pad thereon, the first conductive pad comprising a generally planar surface having a center, and the second substrate has a second conductive pad thereon, the second conductive pad comprising a generally planar surface having a center, said method comprising:
providing a metal member having a lower melting temperature than the material of the first and second conductive pads;
locating the first conductive pad on the first substrate in a facing relationship with the second conductive pad on the second substrate, wherein the center of the first conductive pad is offset from the center of the second conductive pad in a direction of the planar surface of one of the first conductive pad or the second conductive pad by a first distance;
melting the metal member;
moving the first and second substrates relative to each other to bring the metal member in the melted state into contact with the first and second conductive pads; and
moving the first and second substrates relative to each other, based on detection of a relative position of the first substrate and the second substrate, in the direction of the planar surface of one of the first conductive pad and the second conductive pad to form a single metal member in a solid state, wherein
when the metal member returns to the solid state, the distance between the center of the first conductive pad and the center of the second conductive pad is a second distance, and the second distance is less that the first distance, and wherein the melted metal member includes a void before moving the first and second substrates relative to each other in the direction of the planar surface of one of the first conductive pad or the second conductive pad, and a volume of the void is reduced by moving the first and second substrates relative to each other in the direction of the planar surface of one of the first conductive pad or the second conductive pad.

17. The method of claim 16, further comprising:
providing a first insulating layer on the first substrate; and
providing an opening in the first insulating layer wherein the first conductive pad is exposed therein.

18. The method of claim 17, wherein the first conductive pad is recessed in the opening in the first insulating layer.

19. The method of claim 18, further comprising:
providing a flux on the first conductive pad; and
locating the metal member on the second conductive pad before locating the first conductive pad on the first substrate in the facing relationship with the second conductive pad on the second substrate.

20. The method of claim 17, further comprising:
providing a second insulating layer on the second substrate; and
providing an opening in the second insulating layer, wherein the second conductive pad is exposed therein, wherein at least one of the first conductive pad and the second conductive pad are recessed within the first or second insulating layer by at least 0.5 µm no more than 50 µm.

* * * * *